(12) United States Patent
Kamibaba et al.

(10) Patent No.: US 10,734,506 B2
(45) Date of Patent: Aug. 4, 2020

(54) SEMICONDUCTOR DEVICE AND SEMICONDUCTOR DEVICE MANUFACTURING METHOD

(71) Applicant: Mitsubishi Electric Corporation, Tokyo (JP)

(72) Inventors: Ryu Kamibaba, Tokyo (JP); Tetsuo Takahashi, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/255,267

(22) Filed: Jan. 23, 2019

(65) Prior Publication Data

US 2019/0326424 A1 Oct. 24, 2019

(30) Foreign Application Priority Data

Apr. 24, 2018 (JP) ................. 2018-082772

(51) Int. Cl.
  *H01L 29/739* (2006.01)
  *H01L 29/10* (2006.01)
  (Continued)

(52) U.S. Cl.
  CPC ........ *H01L 29/7397* (2013.01); *H01L 21/266* (2013.01); *H01L 21/26513* (2013.01); *H01L 27/0623* (2013.01); *H01L 27/0629* (2013.01); *H01L 29/1004* (2013.01); *H01L 29/1095* (2013.01); *H01L 29/4236* (2013.01);
  (Continued)

(58) Field of Classification Search
  CPC ................. H01L 29/7397; H01L 27/0623
  See application file for complete search history.

(56) References Cited

U.S. PATENT DOCUMENTS

| | | |
|---|---|---|
| 2015/0380536 A1 | 12/2015 | Kimura et al. |
| 2016/0141400 A1* | 5/2016 | Takahashi ........... H01L 29/7397 257/140 |
| 2017/0047322 A1 | 2/2017 | Yoshida et al. |

FOREIGN PATENT DOCUMENTS

| | | |
|---|---|---|
| JP | H11-097715 A | 4/1999 |
| WO | 2014/125583 A1 | 8/2014 |
| WO | 2016/080269 A1 | 5/2016 |

* cited by examiner

*Primary Examiner* — Farun Lu
(74) *Attorney, Agent, or Firm* — Studebaker & Brackett PC

(57) ABSTRACT

A semiconductor device that includes transistor and diode regions in one semiconductor substrate achieves favorable tolerance during recovery behaviors of diodes. A semiconductor base includes an n⁻-type drift layer in the IGBT and diode regions. In the IGBT region, the semiconductor base includes a p-type base layer formed on the n⁻-type drift layer, a p⁺-type diffusion layer and an n⁺-type emitter layer formed selectively on the p-type base layer, the diffusion layer having a higher p-type impurity concentration than the p-type base layer, and gate electrodes facing the p-type base layer via a gate insulating film. In the diode region, the semiconductor base includes a p⁻-type anode layer formed on the n⁻-type drift layer. The p⁺-type diffusion layer has a higher p-type impurity concentration than the p⁻-type anode layer, and has a smaller depth and a lower p-type impurity concentration as approaching the diode region.

5 Claims, 10 Drawing Sheets

(51) Int. Cl.
*H01L 27/06* (2006.01)
*H01L 29/423* (2006.01)
*H01L 21/266* (2006.01)
*H01L 29/66* (2006.01)
*H01L 21/265* (2006.01)
*H01L 29/49* (2006.01)
*H01L 29/45* (2006.01)

(52) U.S. Cl.
CPC .... *H01L 29/66348* (2013.01); *H01L 29/7391* (2013.01); *H01L 29/456* (2013.01); *H01L 29/4958* (2013.01); *H01L 29/4966* (2013.01)

SEMICONDUCTOR DEVICE AND SEMICONDUCTOR DEVICE MANUFACTURING METHOD

BACKGROUND OF THE INVENTION

Field of the Invention

The present invention relates to a semiconductor device and a semiconductor device manufacturing method.

Description of the Background Art

Many inverter devices that have conventionally been used in equipment in a wide variety of fields such as home appliances, electric automobiles, and railroads drive an inductive load such as an induction motor. The inverter devices are configured using multiple switching elements such as insulated gate bipolar transistors (IGBTs) or metal-oxide-semiconductor field-effect transistors (MOSFETs) and multiple power semiconductor devices such as free-wheeling diodes (hereinafter, simply referred to as "diodes"). The inverter devices are required to be highly efficient and low-power consuming. Thus, there is market demand for improvement in performance and reduction in cost of power semiconductor devices.

For the improvement in performance and reduction in cost of power semiconductor devices, developments have sought to provide trench MOS gate structures and reverse conducting IGBTs (RC-IGBTs) and to achieve a reduction in the thickness of a semiconductor substrate. The RC-IGBTs refer to devices fabricated by embedding IGBTs and diodes as an integral unit in one semiconductor substrate. One method of obtaining favorable electrical characteristics of the RC-IGBTs is forming an optimum diffusion layer for each of the IGBTs and the diodes.

International Publication WO 2016/080269 (Patent Literature 1) is an example of prior art documents regarding RC-IGBTs. The RC-IGBT disclosed in Patent Literature 1 has an intermediate region on the front surface side and a p+-type collector region on the back surface side in order to prevent interference between adjacent ones of IGBTs and diodes.

In general, an IGBT region of the RC-IGBT has a layered structure consisting of a semiconductor substrate, a barrier metal, a tungsten plug, and a surface electrode. The semiconductor substrate includes a $p^+$-type diffusion layer, a p-type base layer, and an $n^+$-type emitter layer on the front side. On the other hand, a diode region of the RC-IGBT includes the semiconductor substrate and the surface electrode. The diode region includes no barrier metal and no tungsten plug. Thus, even if a $p^-$-type anode layer having a low impurity concentration is provided in the diode region, ohmic contact can be established between the $p^-$-type anode layer and the surface electrode.

However, the IGBT region adjacent to the diode region includes the p-type base layer and the $p^+$-type diffusion layer. These layers have a great influence on the RC-IGBT when the RC-IGBT operates as a diode. In particular, during a recovery behavior performed when the diode switches from on to off, hole carriers are concentrated in the $p^+$-type diffusion layer having lower resistance than the $p^-$-type anode layer. This leads to an increase in breaking current and causes a breakdown.

SUMMARY

It is an object of the present invention to achieve favorable tolerance during a recovery behavior of a diode in a semiconductor device in which a transistor region and a diode region are provided together in one semiconductor substrate.

A first semiconductor device according to the present invention includes a semiconductor base having one main surface and the other main surface. The semiconductor base is divided into a transistor region and a diode region. The transistor region configures a transistor from the one main surface to the other main surface. The diode region configures a diode from the one main surface to the other main surface. The semiconductor base includes a drift layer of a first conductivity type in the transistor region and the diode region. The semiconductor base includes, in the transistor region, a base layer of a second conductivity type, a diffusion layer of the second conductivity type, an emitter layer of the first conductivity type, and a gate electrode. The base layer is formed on the drift layer. The diffusion layer and the emitter layer are formed selectively on the base layer. The diffusion layer has a higher second conductivity type impurity concentration than the base layer. The gate electrode faces the base layer via an insulating film. The semiconductor base includes, in the diode region, an anode layer of the second conductivity type. The anode layer is formed on the drift layer. The diffusion layer has a higher second conductivity type impurity concentration than the anode layer, and has a smaller depth and a lower second conductivity type impurity concentration as approaching the diode region.

In the first semiconductor device according to the present invention, the diffusion layer has a higher second conductivity type impurity concentration than the anode layer. The diffusion layer has a smaller depth and a lower second conductivity type impurity concentration as approaching the diode region. Accordingly, emissions of hole carriers accumulated in the drift layer are not concentrated in the diffusion layer of the transistor region during a turn-off behavior of the diode. This achieves favorable recovery tolerance.

A second semiconductor device according to the present invention includes a semiconductor base having one main surface and the other main surface. The semiconductor base is divided into a transistor region, a diode region, and a device isolation region. The transistor region configures a transistor from the one main surface to the other main surface. The diode region configures a diode from the one main surface to the other main surface. The device isolation region is provided between the transistor region and the diode region that extend from the one main surface to the other main surface. The semiconductor base includes a drift layer of a first conductivity type in the transistor region, the diode region, and the device isolation region. The semiconductor base includes, in the transistor region, a base layer of a second conductivity type, a diffusion layer of the second conductivity type, an emitter layer of the first conductivity type, and a gate electrode. The base layer is formed on the drift layer. The diffusion layer and the emitter layer are formed selectively on the base layer. The diffusion layer has a higher second conductivity type impurity concentration than the base layer. The gate electrode faces the base layer via an insulating film. The semiconductor base includes, in the diode region, an anode layer of the second conductivity type. The anode layer is formed on the drift layer. The semiconductor base includes no diffusion layer in the device isolation region.

The second semiconductor device according to the present invention includes the device isolation region between the transistor region and the diode region. Accordingly, emissions of hole carriers accumulated in the drift layer are

DESCRIPTION OF THE PREFERRED EMBODIMENTS

Figure 1:
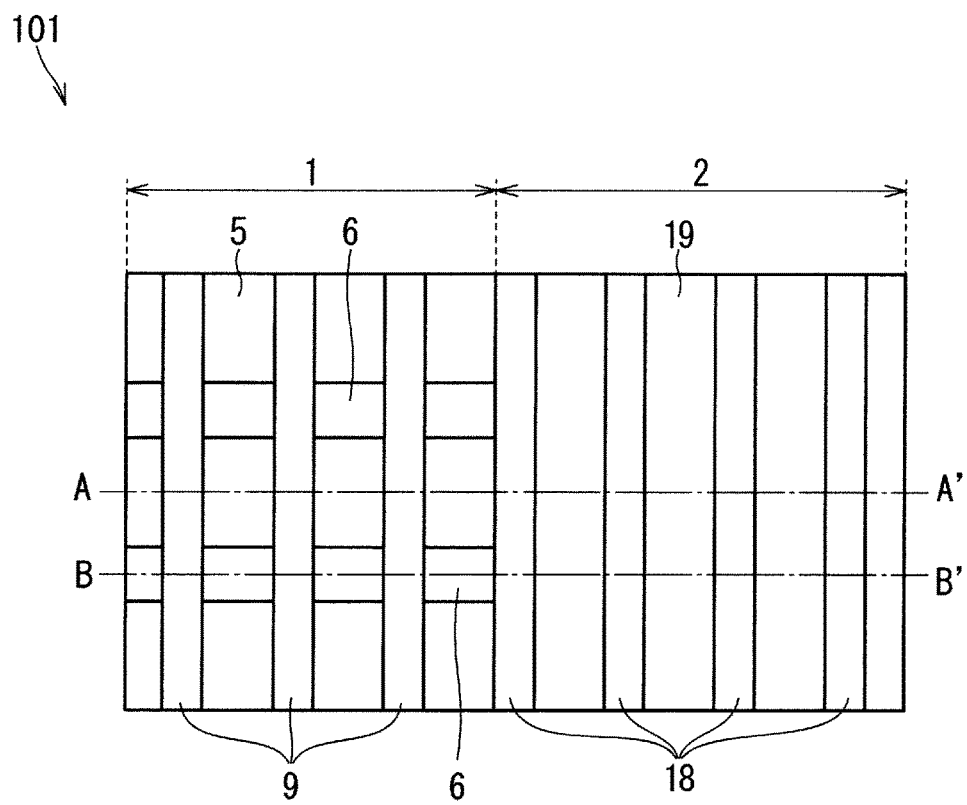
FIG. 1 is a plan view of a semiconductor device according to a first preferred embodiment, viewed from one main surface side.

Preferred embodiments will be described hereinafter with reference to the accompanying drawings. Since the drawings are illustrated in schematic form, the relative sizes and positions of images illustrated in different drawings are not always accurate and can be changed appropriately. In the following description, the same constituent elements are shown with the same reference numerals and assumed to have the same names and the same functions. Thus, detailed description of such constituent elements may be omitted in some cases.

In the following description, terms such as "upper," "lower," "side," "bottom," "front," and "back" may be used to indicate specific positions and directions. Those terms are, however, merely used for convenience's sake in order to facilitate understanding of the content of preferred embodiments. Thus, they are not intended to limit directions during actual implementation.

Description is given assuming that a first conductivity type of semiconductors is an n-type and a second conductivity type is a p-type. Alternatively, these conductivity types may be used in the reverse way, i.e., the first conductivity type as a p-type and the second conductivity type as an n-type. An $n^+$-type means having a higher impurity concentration than the n-type, and an $n^-$-type means having a lower impurity concentration than the n-type. Similarly, a $p^+$-type means having a higher impurity concentration than the p-type, and a $p^-$-type means having a lower impurity concentration than the p-type.

A. Prerequisite Technique

Figure 12:
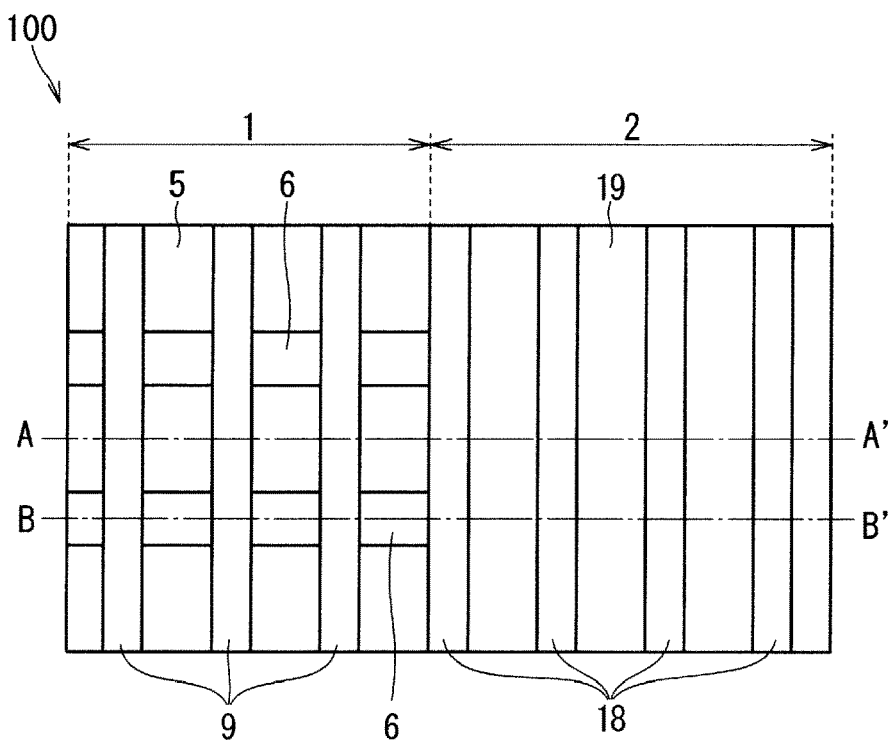
FIG. 12 is a plan view of a semiconductor device according to a prerequisite technique, viewed from one main surface side.
Figure 13:
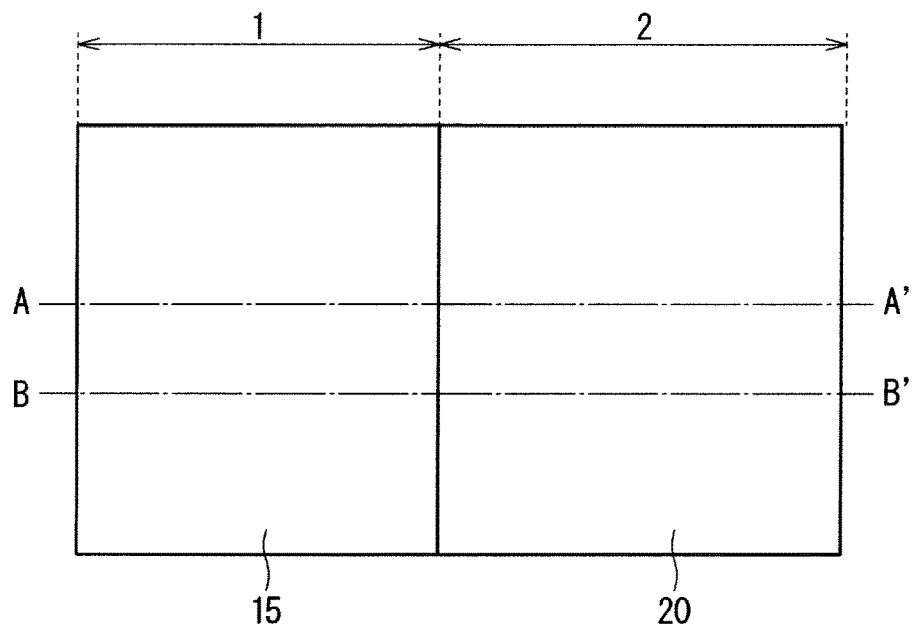
FIG. 13 is a plan view of the semiconductor device according to the prerequisite technique, viewed from the other main surface side.
Figure 14:
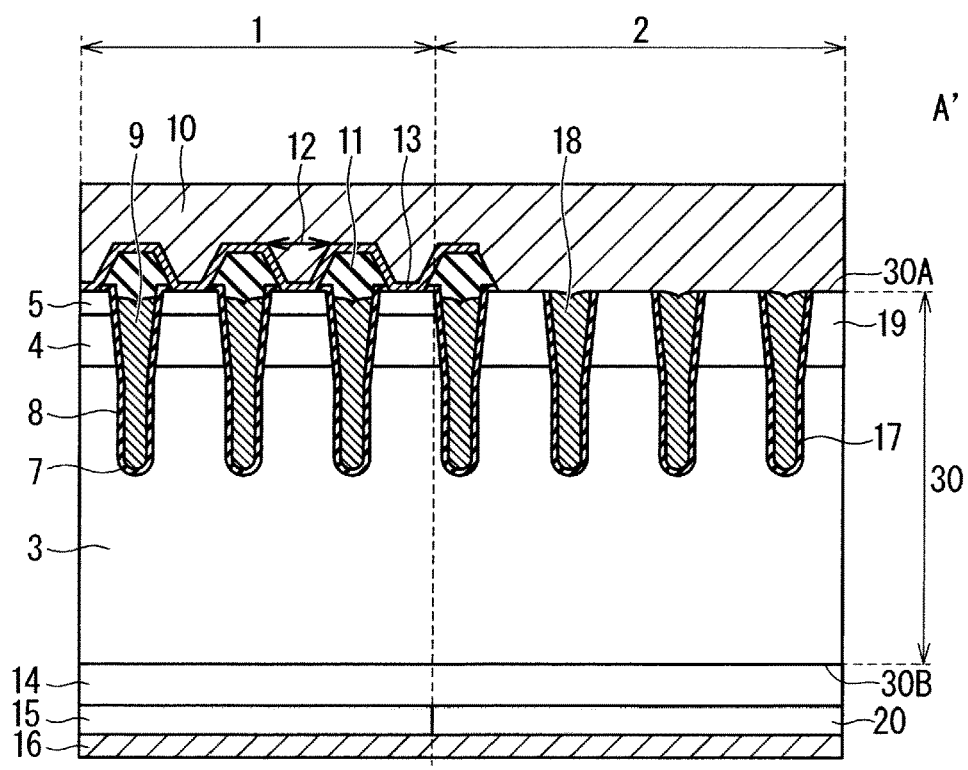
FIG. 14 is a sectional view of the semiconductor device according to the prerequisite technique, taken along a line A-A'.
Figure 15:
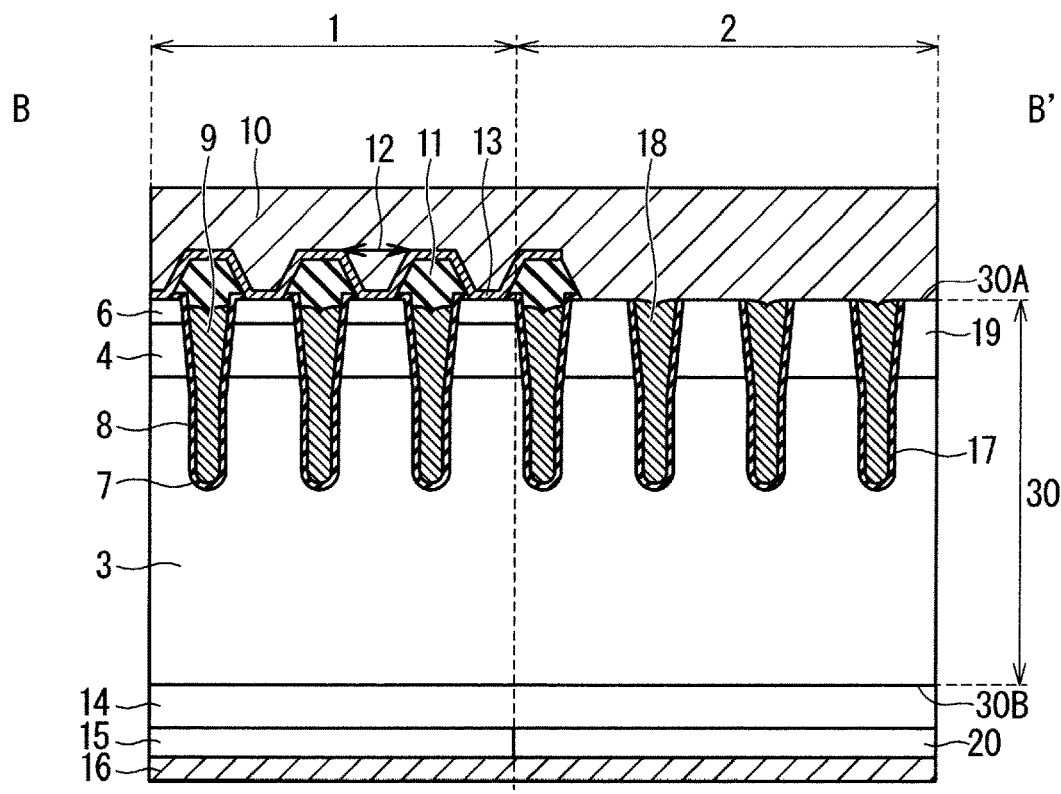
FIG. 15 is a sectional view of the semiconductor device according to the prerequisite technique, taken along a line B-B'.

First, a configuration of an RC-IGBT 100 according to a prerequisite technique of the present invention will be described. FIG. 12 is a plan view of the RC-IGBT 100, viewed from one main surface 30A, and FIG. 13 is a plan view of the RC-IGBT 100, viewed from the other main surface 30B. Note that frontside and backside structures of the RC-IGBT 100 are not shown in FIGS. 12 and 13. FIG. 14 is a sectional view of the RC-IGBT 100, taken along a line A-A' passing through a $p^+$-type diffusion layer 5, and FIG. 15 is a sectional view of the RC-IGBT 100, taken along a line B-B' passing through an $n^+$-type emitter layer 6.

The RC-IGBT 100 is configured such that an IGBT region 1 and a diode region 2 are provided together in one semiconductor substrate. The semiconductor substrate contains, for example, silicon (Si). The IGBT region 1 is a region that includes transistors, and the diode region 2 is a region that includes diodes. The RC-IGBT 100 includes a semiconductor base 30 having one main surface 30A and the other main surface 30B, a frontside structure formed in the one main surface 30A of the semiconductor base 30, and a backside structure formed in the other main surface 30B of the semiconductor base 30.

First, a configuration of the IGBT region 1 will be described. In the IGBT region 1, the semiconductor base 30 includes an $n^-$-type drift layer 3, a p-type base layer 4, the $p^+$-type diffusion layer 5, the $n^+$-type emitter layer 6, a gate insulating film 8, and gate electrodes 9. The p-type base layer 4 is formed on the upper surface of the $n^-$-type drift layer 3. The $p^+$-type diffusion layer 5 and the $n^+$-type emitter layer 6 are formed selectively on the upper surface of the p-type base layer 4. Specifically, the p+-type diffusion layer 5 is formed on the upper surface of the p-type base layer 4 in A-A' section, and the $n^+$-type emitter layer 6 is formed on the upper surface of the p-type base layer 4 in B-B' section. The $n^+$-type emitter layer 6 is formed to surround the $p^+$-type diffusion layer 5 in plan view. The semiconductor base 30 has a plurality of trenches 7 formed from the upper surface of the $p^+$-type diffusion layer 5 or the $n^+$-type emitter layer 6 through the p+-type diffusion layer 5 or the n+-type emitter layer 6 and the p-type base layer 4 to the $n^-$-type drift layer 3. Each trench 7 has embedded therein a gate electrode 9 via the gate insulating film 8. The gate electrodes 9 face the p-type base layer 4 via the gate insulating film 8.

In the IGBT region 1, the frontside structure of the RC-IGBT 100 includes an emitter electrode 10, an interlayer insulating film 11, and a barrier metal 13. The interlayer insulating film 11 covers the gate electrodes 9 so as to insulate the gate electrodes 9 from the emitter electrode 10.

The interlayer insulating film 11 has contact holes 12, from which the p$^+$-type diffusion layer 5 and the n$^+$-type emitter layer 6 are exposed.

The barrier metal 13 is formed on the interlayer insulating film 11 and inside the contact holes 12. The barrier metal 13 is in contact with the upper surfaces of the p$^+$-type diffusion layer 5 and the n$^+$-type emitter layer 6 in the contact holes 12. The barrier metal 13 is silicided when coming in contact with a silicon semiconductor, and has the effect of reducing contact resistance between the n$^+$-type emitter layer 6 and the p$^+$-type diffusion layer 5. In some cases, a tungsten plug may be formed on the barrier metal 13 in order to achieve finer design rules. In the case of using a tungsten plug for the contact holes 12, the barrier metal 13 typically uses transition metal, e.g., a multi-layer structure of titanium or titanium nitride, in order to achieve the aforementioned effect. The emitter electrode 10 is formed on the barrier metal 13 or on the barrier metal 13 and the tungsten plug. The emitter electrode 10 is typically made of an aluminum alloy. The emitter electrode 10 is joined to the n$^+$-type emitter layer 6 and the p$^+$-type diffusion layer 5 via the barrier metal 13.

In the IGBT region 1, the backside structure of the RC-IGBT 100 includes an n-type buffer layer 14, a p-type collector layer 15, and a collector electrode 16. The RC-IGBT 100 achieves a high channel density with a trench MOS gate structure consisting of the p-type base layer 4, the p$^+$-type diffusion layer 5, the gate insulating film 8, and the gate electrodes 9 and achieves low loss by reducing the thickness of the n$^-$-type drift layer 3. If the thickness of the n$^-$-type drift layer 3 is reduced, a stopper is necessary for a depletion layer that extends from the pn junction of the p-type base layer 4 and the n$^-$-type drift layer 3 at switch-off. Thus, the n-type buffer layer 14 having a higher impurity concentration than the n$^-$-type drift layer 3 is provided as the stopper. Note that the presence or absence of the n-type buffer layer 14 is determined according to product usage. Thus, the n-type buffer layer 14 may not be provided in some cases, depending on product usage.

At turn-on of the IGBT, the p-type base layer 4, the n$^+$-type emitter layer 6, the gate insulating film 8, and the gate electrodes 9 constitute n-channel MOSFETs, and current flows in a path of the p-type collector layer 15, the n-type buffer layer 14, the n$^-$-type drift layer 3, the p-type base layer 4, and the n$^+$-type emitter layer 6. That is, the p-type base layer 4, the n$^+$-type emitter layer 6, the gate insulating film 8, and the gate electrodes 9 constitute a transistor structure, more specifically a trench MOS gate structure. The semiconductor base 30 includes a plurality of trench MOS gate structures in the IGBT region 1. Note that the p$^+$-type diffusion layer 5 has the effects of emitting carries generated at switch-off and reducing contact resistance with the emitter electrode 10. The foregoing is the configuration of the IGBT region 1.

Next, a configuration of the diode region 2 will be described. In the diode region 2, the semiconductor base 30 includes the if-type drift layer 3, dummy gate electrodes 18, and a p$^-$-type anode layer 19. The n$^-$-type drift layer 3 is common between the IGBT region 1 and the diode region 2. In the diode region 2, the p$^-$-type anode layer 19 is formed on the upper surface of the n$^-$-type drift layer 3. The semiconductor base 30 has a plurality of trenches 7 formed from the upper surface of the p$^-$-type anode layer 19 through the p$^-$-type anode layer 19 to the n$^-$-type drift layer 3. Each trench 7 has embedded therein a dummy gate electrode 18 via a dummy gate insulating film 17.

In the diode region 2, the frontside structure of the RC-IGBT 100 includes the emitter electrode 10. The emitter electrode 10 is common between the IGBT region 1 and the diode region 2 and made of, for example, an aluminum alloy. The sharing of the emitter electrode 10 between the IGBT region 1 and the diode region 2 allows the IGBT region 1 and the diode region 2 to have the same conditions, such as wire bonding and solder wettability, in the assembly process using the RC-IGBT 100. The p$^-$-type anode layer 19 has a low p-type impurity concentration and accordingly helps obtaining favorable diode characteristics. However, if the p$^-$-type anode layer 19 comes in contact with the barrier metal 13, a Schottky junction is created and contact resistance increases. Therefore, the barrier metal 13 is not provided in the diode region 2.

In the diode region 2, the backside structure of the RC-IGBT 100 includes the n-type buffer layer 14, an n$^+$-type cathode layer 20, and the collector electrode 16. The n-type buffer layer 14 and the collector electrode 16 are common between the IGBT region 1 and the diode region 2. The foregoing is the configuration of the diode region 2.

A turn-on behavior of the diode will now be described. When a positive voltage is applied between the emitter electrode 10 and the collector electrode 16, hole carriers 21 are injected from the p$^-$-type anode layer 19, and electron carriers 22 are injected from the n$^+$-type cathode layer 20. When the applied voltage becomes greater than or equal to a drop voltage, the diode enters an ON state. When the diode has entered an ON state, current flows in a path of the emitter electrode 10, the p$^-$-type anode layer 19, the n$^-$-type drift layer 3, the n$^+$-type cathode layer 20, and the collector electrode 16.

Figure 16:
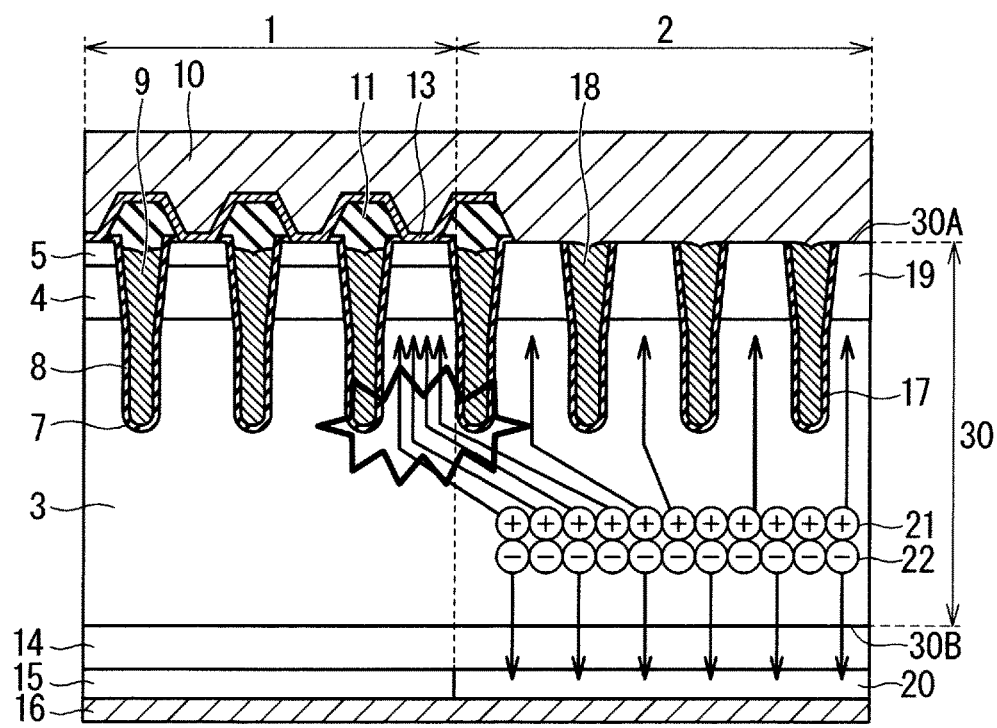
FIG. 16 illustrates movements of carriers in the semiconductor device according to the prerequisite technique.

Next, a turn-off behavior of the diode will described. The diode generally exhibits a recovery behavior when switching from on to off. The recovery behavior refers to a behavior of returning to an OFF state after a temporary flow of current to the negative side of the diode. This period is called a reverse recovery time. A peak value of negative current generated during the reverse recovery time is referred to as recovery current, and generated loss as recovery loss. During the reverse recovery time in a device of a single diode, hole carriers 21 flow to the p$^-$-type anode layer 19, and the electron carriers 22 flow to the n$^+$-type cathode layer 20. The RC-IGBT 100, however, includes the p$^+$-type diffusion layer 5 and the p-type base layer 4 that have lower resistance than the p$^-$-type anode layer 19, in the IGBT region 1 adjacent to the diode region 2. Thus, the hole carriers 21 flow into the IGBT region 1 during the recovery behavior as illustrated in FIG. 16. This causes the concentration of current at the boundary between the IGBT region 1 and the diode region 2 and causes recovery breakdown.

B. First Preferred Embodiment

A first preferred embodiment solves the above-described problem by causing the p$^+$-type diffusion layer 5 formed in the IGBT region 1 to have a gradient depth and a gradient impurity concentration.

B-1. Configuration

Figure 2:
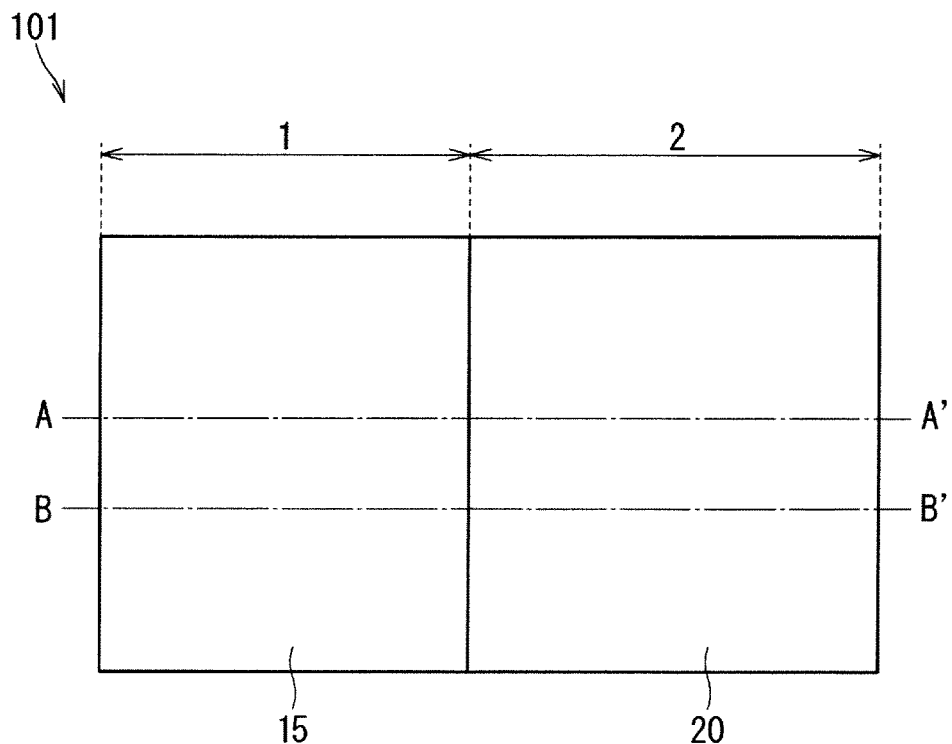
FIG. 2 is a plan view of the semiconductor device according to the first preferred embodiment, viewed from the other main surface side.
Figure 3:
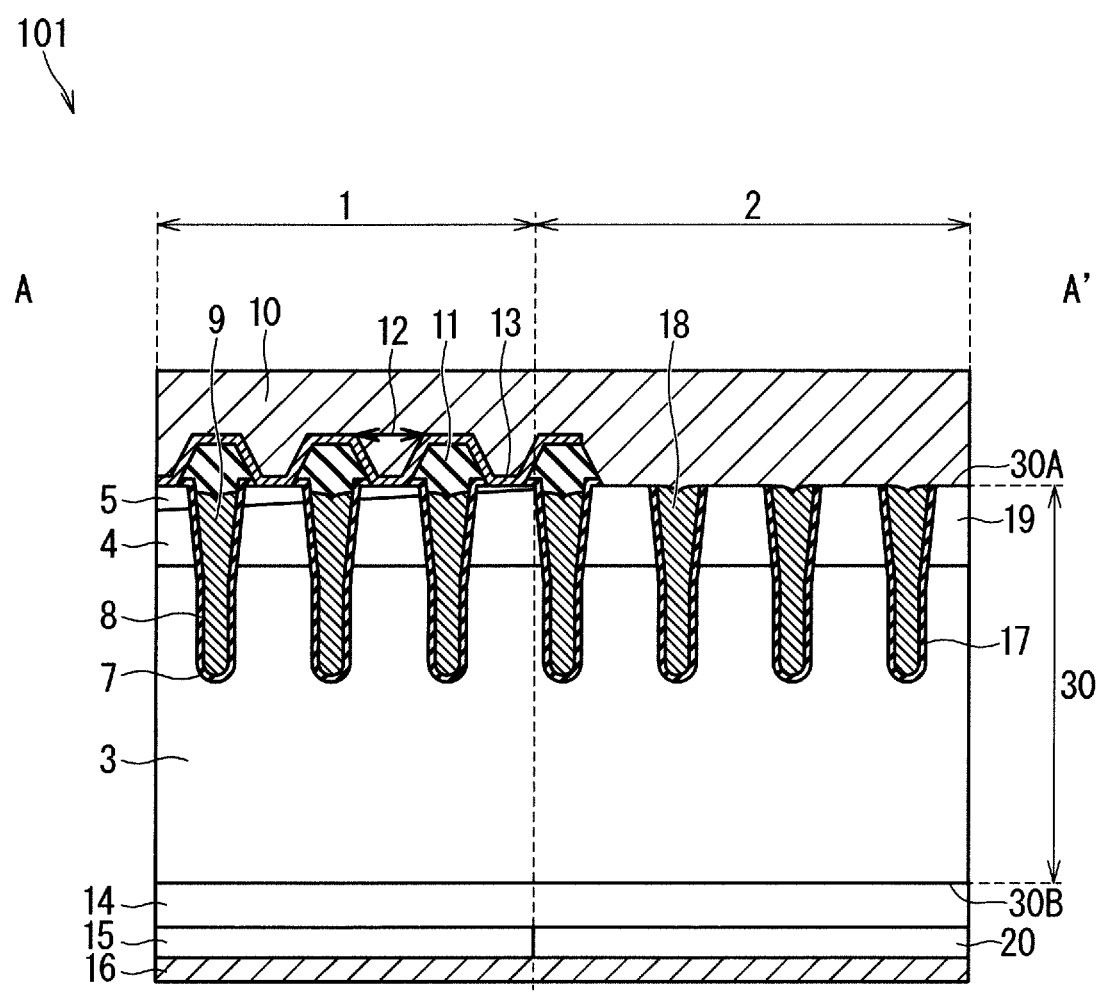
FIG. 3 is a sectional view of the semiconductor device according to the first preferred embodiment, taken along a line A-A'.
Figure 4:
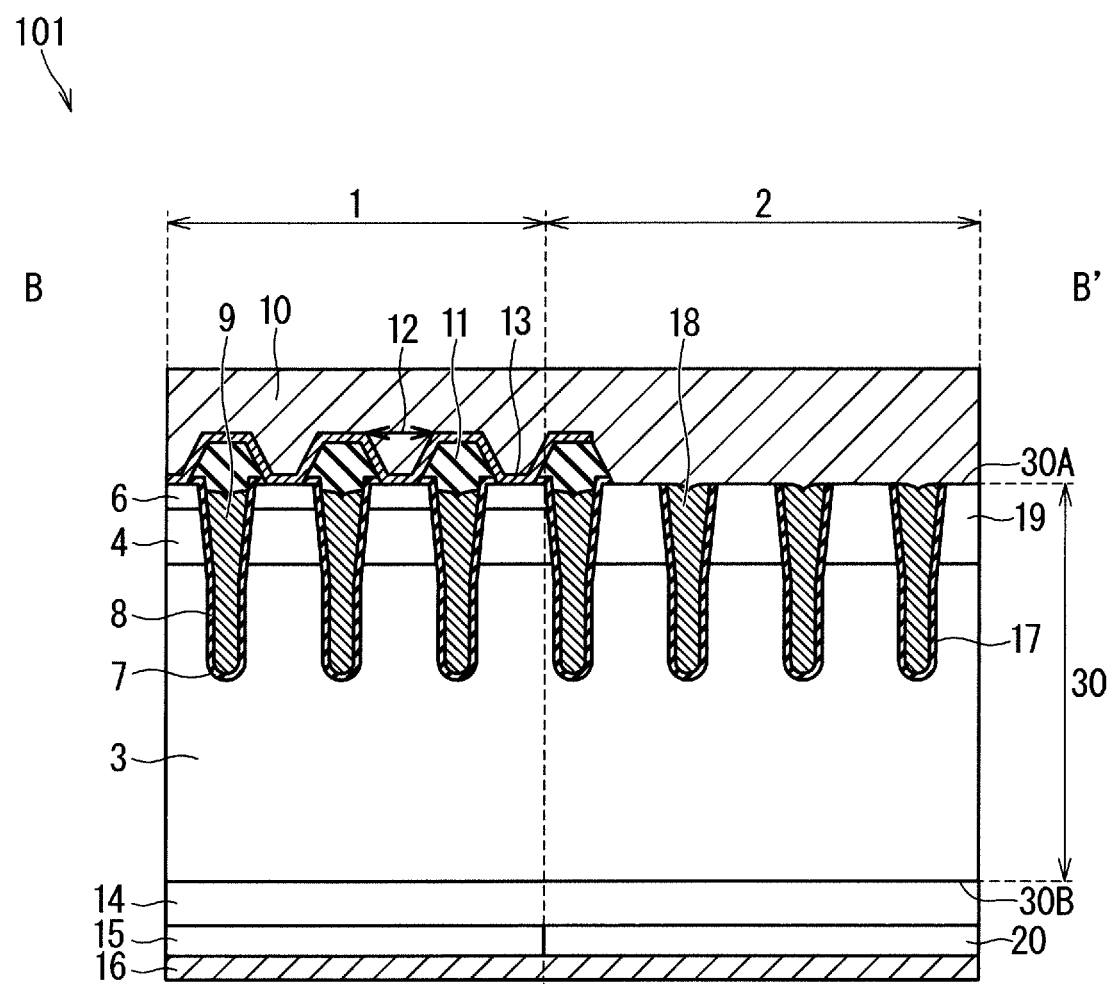
FIG. 4 is a sectional view of the semiconductor device according to the first preferred embodiment, taken along a line B-B'.

FIG. 1 is a plan view of an RC-IGBT 101 that is a semiconductor device according to the first preferred embodiment, viewed from the one main surface 30A. FIG. 2 is a plan view of the RC-IGBT 101, viewed from the other main surface 30B. Note that frontside and backside structures of the RC-IGBT 101 are not shown in FIGS. 1 and 2. FIG. 3 is a sectional view of the RC-IGBT 101, taken along a line A-A' passing through the p$^+$-type diffusion layer 5. FIG. 4 is a sectional view of the RC-IGBT 101, taken along a line B-B' passing through the n$^+$-type emitter layer 6.

The configuration of the RC-IGBT 101 other than the p$^+$-type diffusion layer 5 is the same as that of the RC-IGBT 100. As illustrated in FIG. 3, the p$^+$-type diffusion layer 5 of the RC-IGBT 101 has a gradient depth and a gradient impurity concentration in a direction approaching the diode region 2, i.e., the left-right direction in the plane of FIG. 3. Specifically, the p$^+$-type diffusion layer 5 has a smaller depth and a lower impurity concentration as it approaches the boundary between the IGBT region 1 and the diode region 2 (hereinafter, simply referred to as the "boundary"). Although not illustrated in FIG. 3, the depth and impurity concentration of the p$^+$-type diffusion layer 5 are made constant at a certain distance or more from the boundary. This avoids a situation where the configuration of the p$^+$-type diffusion layer 5 having a gradient depth and a gradient impurity concentration reduces transistor performance. The distance from the boundary at which the depth and impurity concentration of the p$^+$-type diffusion layer 5 becomes constant is set according to various factors such as product usage of the RC-IGBT 101, the thickness of the ti-type drift layer 3, and the concentration in the p$^-$-type anode layer 19.

B-2. Variations

Figure 5:
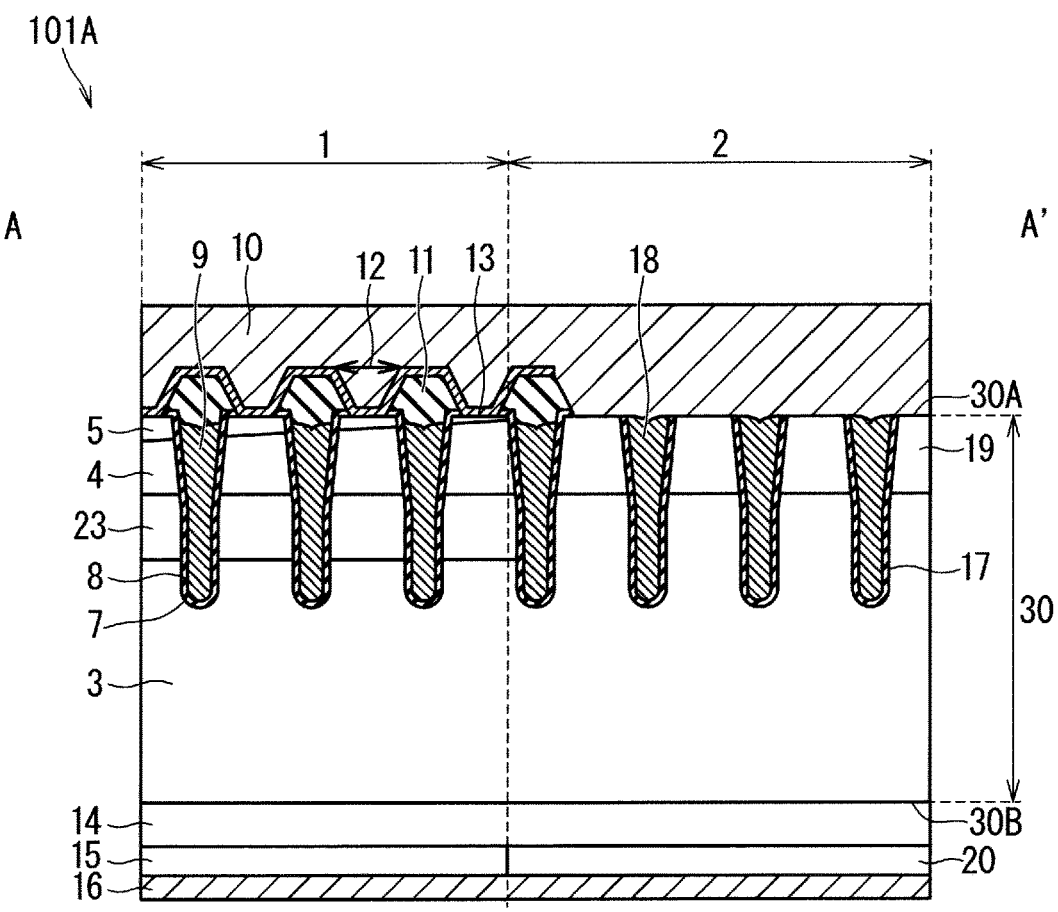
FIG. 5 is a sectional view of a semiconductor device according to a variation of the first preferred embodiment, taken along the line A-A'.

FIG. 5 is a sectional view of an RC-IGBT 101A that is a semiconductor device according to a variation of the first preferred embodiment, taken along the line A-A' passing through the p$^+$-type diffusion layer 5. The semiconductor base 30 of the RC-IGBT 101A includes an n-type carrier storage layer 23 on the lower surface side of the p-type base layer 4 in the IGBT region 1. The presence of the n-type carrier storage layer 23 suppresses emissions of hole carriers from the p+-type diffusion layer 5 and the p-type base layer 4 and reduces ON-state resistance of the p-type base layer 4 and the n$^-$-type drift layer 3 when the transistor is conducting. It is thus possible to lower the ON-state voltage and reduce steady loss.

FIGS. 3 to 5 illustrate configurations in which the gate electrodes 9 and the dummy gate electrodes 18 of the RC-IGBTs 101 and 101A are formed in the trenches 7. These electrodes, however, do not necessarily have to be formed in the trenches 7.

B-3. Manufacturing Method

Figure 6:
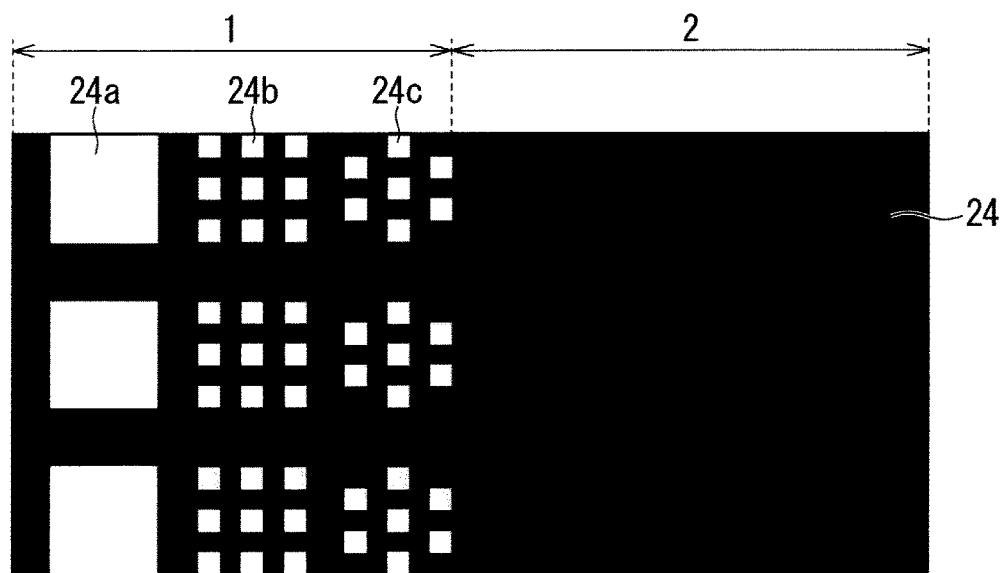
FIG. 6 illustrates a resist mask used in manufacture of the semiconductor device according to the first preferred embodiment.

Next, a method of forming the p$^+$-type diffusion layer 5 of the RC-IGBTs 101 and 101A will be described. In the IGBT region 1, first, the p-type base layer 4 is formed on the upper surface of the ri-type drift layer 3. Then, the p$^+$-type diffusion layer 5 is formed on the p-type base layer 4. FIG. 6 is a plan view of a resist mask 24 that is used to form the p$^+$-type diffusion layer 5, viewed from the one main surface 30A of the semiconductor base 30. The resist mask 24 covers the entire surface of the diode region 2, but has openings 24a, 24b, and 24c in the IGBT region 1. In order for the p$^+$-type diffusion layer 5 to have a gradient depth and a gradient impurity concentration, in general, a photolithographic process and an ion implantation process are performed multiple times to control implantation energy and a dose during the ion implantation process. This method, however, increases cost due to a large number of processing steps in the wafer process. In view of this, the openings 24a, 24b, and 24c forming a dot pattern are formed in the resist mask 24 as illustrated in FIG. 6 to control the density of ion implantation. The opening 24a includes one large opening, the opening 24b includes nine small openings, and the opening 24c includes seven small openings. In this way, the opening density is made smaller in a direction approaching the boundary between the IGBT region 1 and the diode region 2. This allows the p+-type diffusion layer 5 to have a lower impurity concentration as approaching the boundary between the IGBT region 1 and the diode region 2 in one ion implantation. Also, the depth of diffusion decreases as the impurity concentration of the p$^+$-type diffusion layer 5 decreases. Thus, the p$^-$-type diffusion layer 5 can have a smaller depth as approaching the boundary between the IGBT region 1 and the diode region 2.

FIG. 6 illustrates merely one example of the openings of the resist mask 24. The sizes, dot pattern shape, and density of the openings are not limited to this example.

B-4. Advantageous Effects

The RC-IGBT 101 according to the first preferred embodiment includes the semiconductor base 30 having one main surface 30A and the other main surface 30B. The semiconductor base 30 is divided into the IGBT region 1 and the diode region 2. The IGBT region 1 is a transistor region that configures a transistor from the one main surface 30A to the other main surface 30B. The diode region 2 configures a diode from the one main surface 30A to the other main surface 30B. The semiconductor base 30 includes the n$^-$-type drift layer 3 in the IGBT region 1 and the diode region 2. In the IGBT region 1, the semiconductor base 30 includes the p-type base layer 4 formed on the n$^-$-type drift layer 3, the p$^+$-type diffusion layer 5 and the n$^+$-type emitter layer 6 formed selectively on the p-type base layer 4, the p$^+$-type diffusion layer 5 having a higher p-type impurity concentration than the p-type base layer 4, and the gate electrodes 9 facing the p-type base layer 4 via the gate insulating film 8 and serving as first gate electrodes. In the diode region 2, the semiconductor base 30 includes the p$^-$-type anode layer 19 formed on the n$^-$-type drift layer 3. The p$^+$-type diffusion layer 5 has a higher p-type impurity concentration than the p$^-$-type anode layer 19, and has a smaller depth and a lower p-type impurity concentration as approaching the diode region 2. Accordingly, emissions of the hole carriers 21 accumulated in the n$^-$-type drift layer 3 during a turn-off behavior of the diode are not concentrated in the p$^+$-type diffusion layer 5 located in the vicinity of the boundary between the transistor region and the diode region. This configuration thus achieves favorable recovery tolerance.

The RC-IGBT 101 according to the first preferred embodiment further includes the emitter electrode 10 disposed via the gate electrode 9 and the interlayer insulating film 11 and serving as a first electrode, and the barrier metal 13 formed between the p$^+$-type diffusion layer 5 and the emitter electrode 10 and between the n$^+$-type emitter layer 6 and the emitter electrode 10. The p$^-$-type anode layer 19 is in direct contact with the emitter electrode 10. In this way, the barrier metal 13 is not formed in the diode region 2. This configuration reduces the impurity concentration of the p$^-$-type anode layer 19 and improves recovery characteristics.

The semiconductor base 30 of the RC-IGBT 101A according to a variation of the first preferred embodiment includes the n-type carrier storage layer 23 of the first conductivity type formed between the n$^-$-type drift layer 3 and the p-type base layer 4 and having a higher impurity concentration than the n$^-$-type drift layer 3. The presence of the n-type carrier storage layer 23 suppresses emissions of hole carriers from the p+-type diffusion layer 5 and the p-type base layer 4 and reduces ON-state resistance of the p-type base layer 4 and the n$^-$-type drift layer 3 when the transistor is conducting. It is thus possible to lower the ON-state voltage and reduce steady loss.

C. Second Preferred Embodiment

The first preferred embodiment solves the problem of recovery breakdown by causing the p$^+$-type diffusion layer 5 in the IGBT region 1 to have a gradient depth and a gradient impurity concentration. In contrast, a second preferred embodiment solves the problem of recovery breakdown by providing a device isolation region 25 at the boundary between the IGBT region 1 and the diode region 2.

C-1. Configuration

Figure 7:
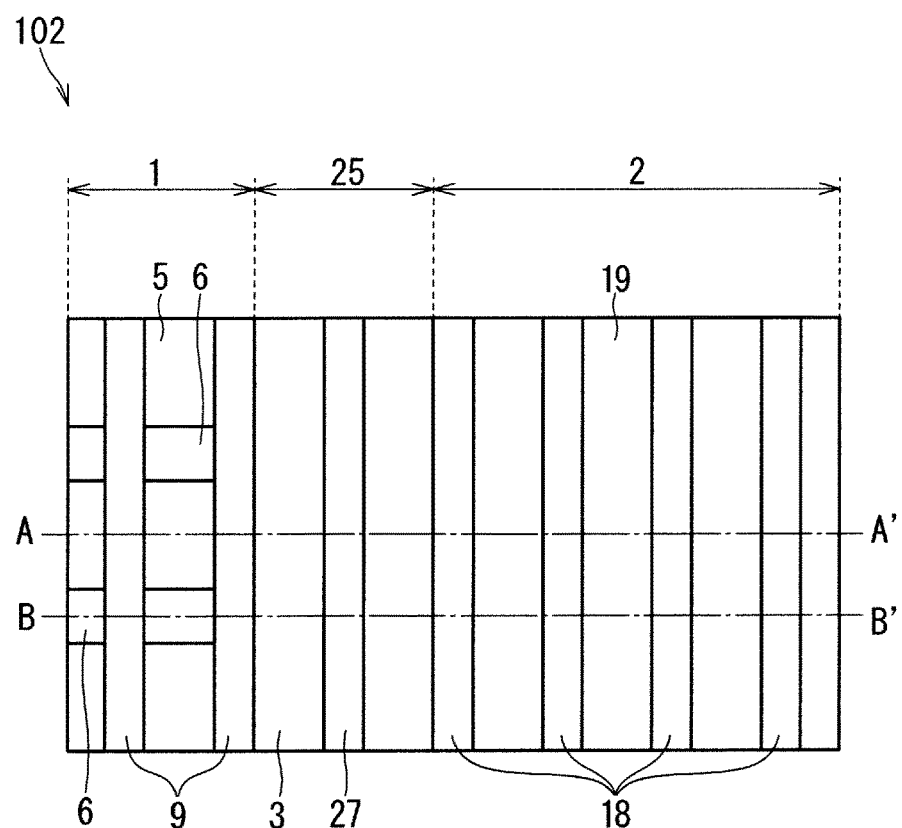
FIG. 7 is a plan view of a semiconductor device according to a second preferred embodiment, viewed from one main surface side.
Figure 8:
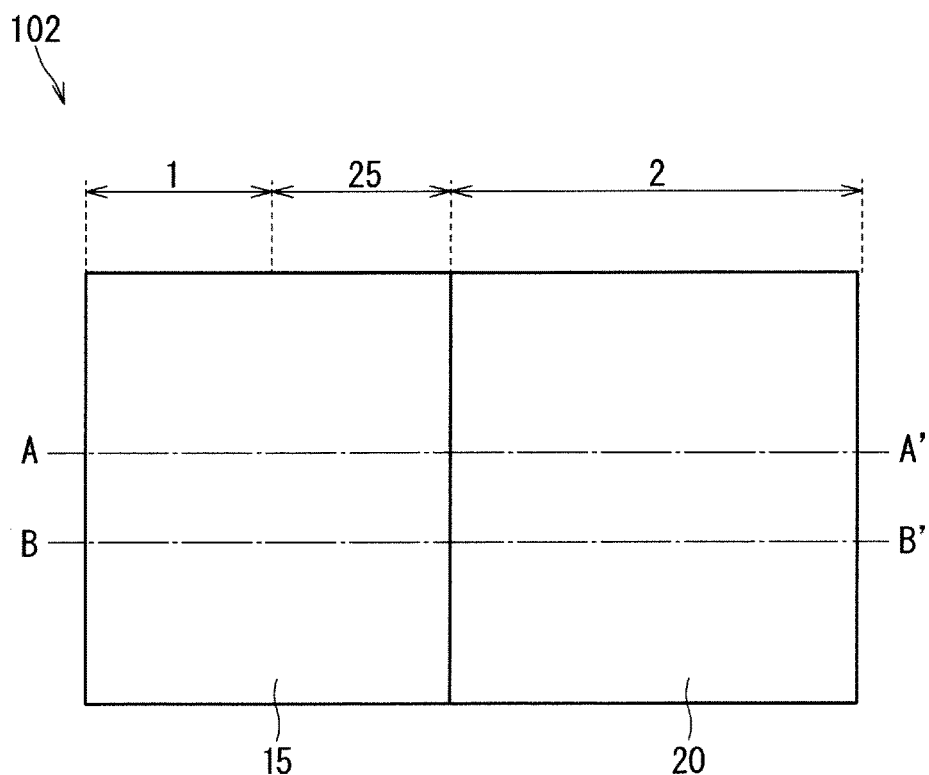
FIG. 8 is a plan view of the semiconductor device according to the second preferred embodiment, viewed from the other main surface side.
Figure 9:
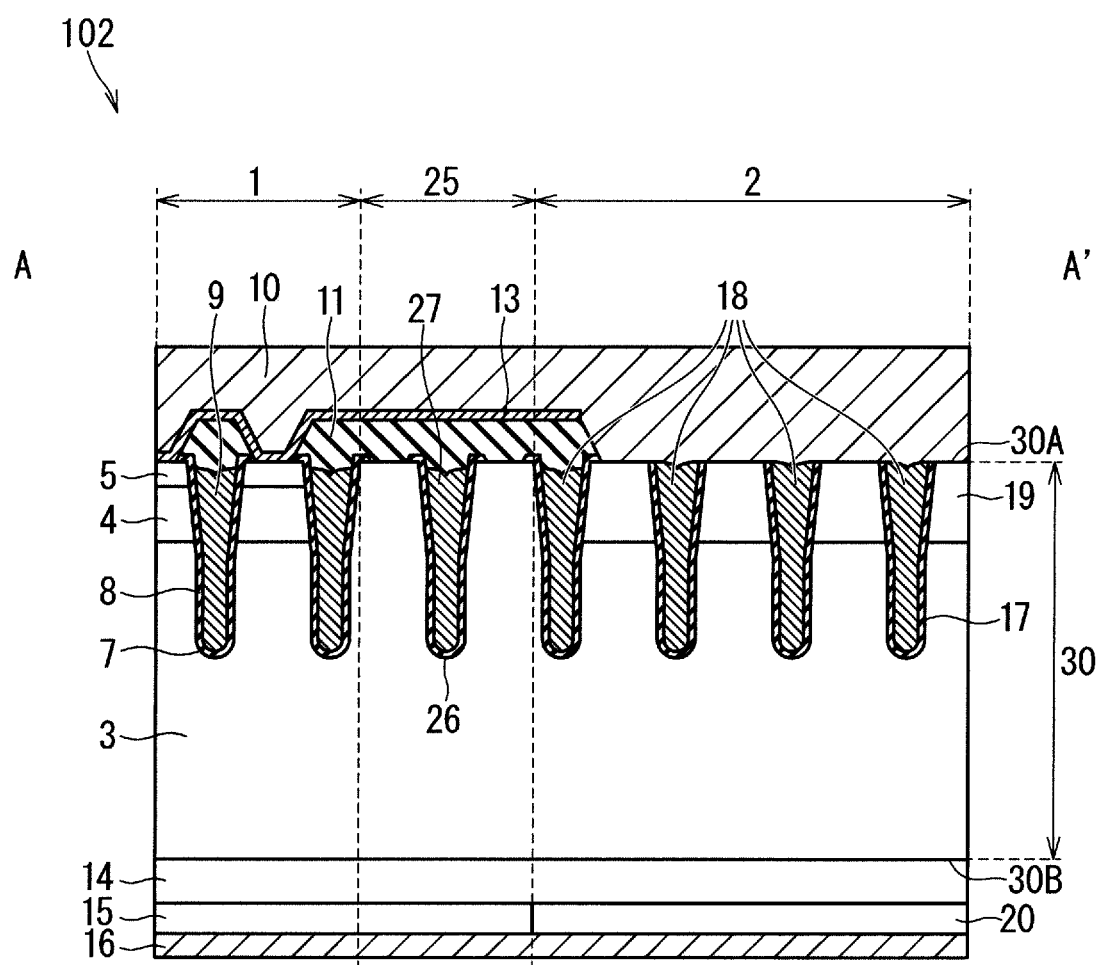
FIG. 9 is a sectional view of the semiconductor device according to the second preferred embodiment, taken along a line A-A'.
Figure 10:
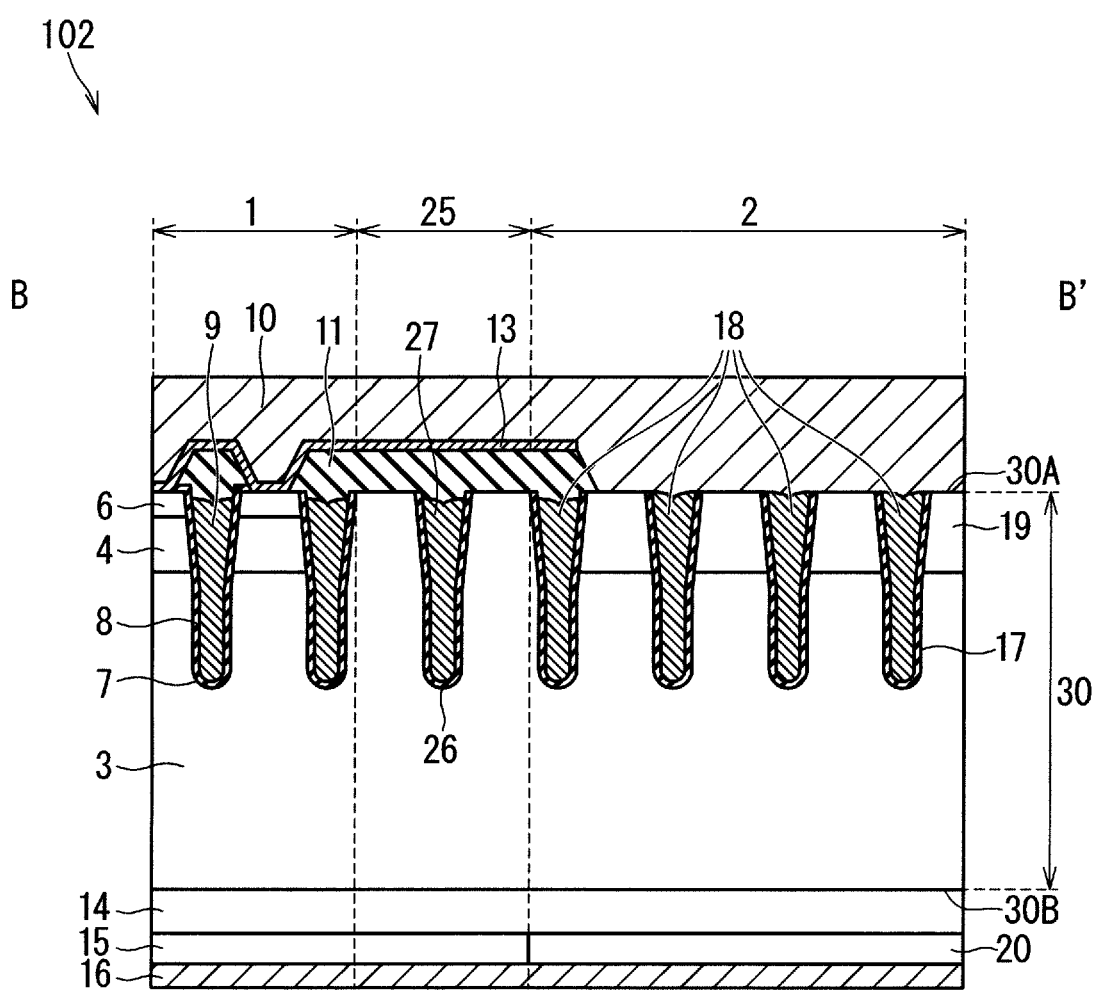
FIG. 10 is a sectional view of the semiconductor device according to the second preferred embodiment, taken along a line B-B'.

FIG. 7 is a plan view of an RC-IGBT 102 that is a semiconductor device according to the second preferred embodiment, viewed from the one main surface 30A. FIG. 8 is a plan view of the RC-IGBT 102, viewed from the other main surface 30B. Note that frontside and backside structures of the RC-IGBT 102 are not shown in FIGS. 7 and 8. FIG. 9 is a sectional view of the RC-IGBT 102, taken along a line A-A' passing through the p$^+$-type diffusion layer 5, and FIG. 10 is a sectional view of the RC-IGBT 102, taken along a line B-B' passing through the n$^+$-type emitter layer 6.

The RC-IGBT 102 includes the IGBT region 1, the diode region 2, and the device isolation region 25 together in one semiconductor substrate. The device isolation region 25 is provided so as to separate the IGBT region 1 and the diode region 2 from each other. The semiconductor substrate contains, for example, silicon (Si). In the IGBT region 1 of the RC-IGBT 102, the p$^+$-type diffusion layer 5 has a constant depth and a constant impurity concentration, and the other configuration of the IGBT region 1 is the same as that of the RC-IGBT 101 according to the first preferred embodiment. The configuration of the diode region 2 of the RC-IGBT 102 is the same as that of the RC-IGBT 101 according to the first preferred embodiment.

In the device isolation region 25, the semiconductor base 30 includes the n$^-$-type drift layer 3 extending from the one main surface 30A to the other main surface 30B. The device isolation region 25 includes no diffusion layer. In the device isolation region 25, the n$^-$-type drift layer 3 has trenches 7 formed in the one main surface 30A. Each trench 7 has embedded therein a dummy electrode 27 via an insulating film 26. The dummy electrodes 27 are connected to the gate electrodes 9 or the emitter electrode 10.

C-2. Variations

Figure 11:
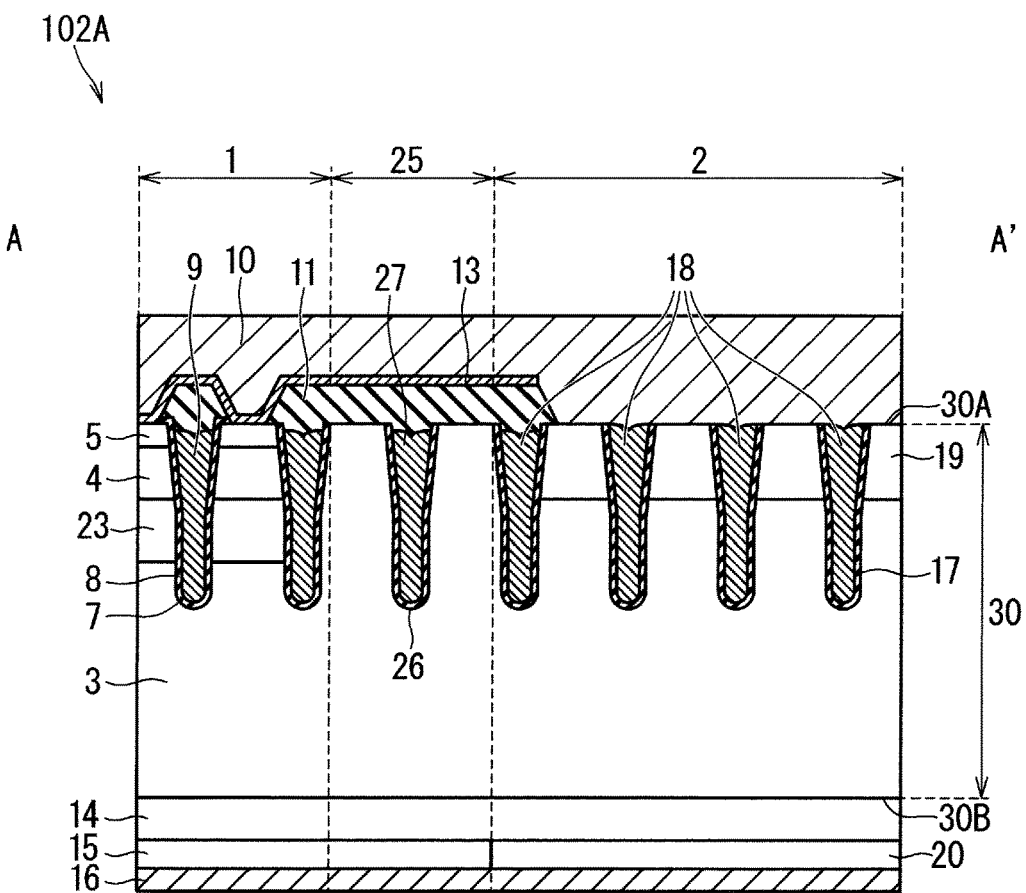
FIG. 11 is a sectional view of a semiconductor device according to a variation of the second preferred embodiment, taken along the line A-A'.

FIG. 11 is a sectional view of an RC-IGBT 102A that is a semiconductor device according to a variation of the second preferred embodiment, taken along the line A-A' passing through the p$^+$-type diffusion layer 5. In the IGBT region 1, the semiconductor base 30 of the RC-IGBT 102A includes the n-type carrier storage layer 23 on the lower surface side of the p-type base layer 4. The presence of the n-type carrier storage layer 23 suppresses emissions of hole carriers from the p+-type diffusion layer 5 and the p-type base layer 4 and reduces ON-state resistance of the p-type base layer 4 and the n$^-$-type drift layer 3 when the transistor is conducting. It is thus possible to lower the ON-state voltage and reduce steady loss.

FIGS. 9 to 11 illustrate configurations in which the gate electrodes 9, the dummy gate electrodes 18, and the dummy electrodes 27 are formed in the trenches 7 of the RC-IGBTs 102 and 102A. These electrodes, however, do not necessarily have to be formed in the trenches 7.

C-3. Advantageous Effects

The RC-IGBT 102 according to the second preferred embodiment includes the semiconductor base 30 having one main surface 30A and the other main surface 30B. The semiconductor base 30 is divided into the IGBT region 1, the diode region 2, and the device isolation region 25. The IGBT region 1 configures a transistor from the one main surface 30A to the other main surface 30B. The diode region 2 configures a diode from the one main surface 30A to the other main surface 30B. The device isolation region 25 is provided between the IGBT region 1 and the diode region 2 that extend from the one main surface 30A to the other main surface 30B. The semiconductor base 30 includes the n$^-$-type drift layer 3 in the IGBT region 1, the diode region 2, and the device isolation region 25. In the IGBT region 1, the semiconductor base 30 includes the p-type base layer 4 formed on the n$^-$-type drift layer 3, the p$^+$-type diffusion layer 5 and the n$^+$-type emitter layer 6 formed selectively on the p-type base layer 4, the p$^+$-type diffusion layer 5 having a higher p-type impurity concentration than the p-type base layer 4, and the gate electrodes 9 facing the p-type base layer 4 via the gate insulating film 8. In the diode region 2, the semiconductor base 30 includes the p$^-$-type anode layer 19 formed on the n$^-$-type drift layer 3. The device isolation region 25 includes no diffusion layer. With the RC-IGBT 102, the n$^-$-type drift layer 3 develops resistance between the IGBT region 1 and the diode region 2. This limits a hole path from the p-type base layer 4 and the p$^+$-type diffusion layer 5 in the IGBT region 1, suppresses the concentration of the hole carriers 21 in the p$^+$-type diffusion layer 5 of the IGBT region 1 during recovery behaviors, and achieves favorable recovery tolerance.

In the RC-IGBT 102 according to the second preferred embodiment, the semiconductor base 30 has the trenches 7 formed in the IGBT region 1 and the device isolation region 25 on the one main surface side. The gate electrodes 9 are embedded in the trenches 7 formed in the IGBT region 1. The semiconductor base 30 also includes the dummy electrodes 27 embedded in the trenches 7 formed in the device isolation region 25. The dummy electrodes 27 are electrically connected to the gate electrodes 9. This increases gate-collector feedback capacitance. It is thus possible to reduce turn-on loss of the IGBT while maintaining low the rate of change over time in the voltage of a freewheeling diode according to product type during a turn-on behavior of the IGBT.

Alternatively, the dummy electrodes 27 may be electrically connected to the emitter electrode 10. In this case, the dummy electrodes 27 have the effect of a field plate that holds a withstand voltage when a voltage is applied between the collector and the emitter.

The semiconductor base 30 of the RC-IGBT 102A according to a variation of the second preferred embodiment includes the n-type carrier storage layer provided between the n$^-$-type drift layer 3 and the p-type base layer 4 and having a higher impurity concentration than the n$^-$-type drift layer 3. The presence of the n-type carrier storage layer 23 suppresses emissions of hole carriers from the p$^+$-type diffusion layer 5 and the p-type base layer 4 and reduces ON-state resistance of the p-type base layer 4 and the n$^-$-type drift layer 3 when the transistor is conducting. It is thus possible to lower the ON-state voltage and reduce steady loss.

While the invention has been shown and described in detail, the foregoing description is in all aspects illustrative and not restrictive. It is therefore to be understood that numerous modifications and variations can be devised without departing from the scope of the invention.

What is claimed is:
1. A semiconductor device comprising:
   a semiconductor base having one main surface and the other main surface,
   wherein the semiconductor base is divided into:
   a transistor region configuring a transistor from the one main surface to the other main surface; and a diode region configuring a diode from the one main surface to the other main surface, the semiconductor base includes a drift layer of a first conductivity type in the transistor region and the diode region, the semiconductor base includes, in the transistor region:

a base layer of a second conductivity type formed on the drift layer;

a diffusion layer of the second conductivity type and an emitter layer of the first conductivity type formed selectively on the base layer, the diffusion layer having a higher second conductivity type impurity concentration than the base layer; and a gate electrode facing the base layer via an insulating film, the semiconductor base includes, in the diode region, an anode layer of the second conductivity type formed on the drift layer, and the diffusion layer has a higher second conductivity type impurity concentration than the anode layer, and has a smaller depth and a lower second conductivity type impurity concentration as approaching the diode region.

2. The semiconductor device according to claim 1, further comprising:

a first electrode disposed via the gate electrode and an interlayer insulating film; and a barrier metal formed between the diffusion layer and the first electrode and between the emitter layer and the first electrode, wherein the anode layer is in direct contact with the first electrode.

3. The semiconductor device according to claim 1, wherein the semiconductor base further includes a carrier storage layer of the first conductivity type formed between the drift layer and the base layer and having a higher impurity concentration than the drift layer.

4. The semiconductor device according to claim 2, wherein the semiconductor base further includes a carrier storage layer of the first conductivity type formed between the drift layer and the base layer and having a higher impurity concentration than the drift layer.

5. A semiconductor device manufacturing method that is a method of manufacturing the semiconductor device according to claim 1, the method comprising:

forming the diffusion layer by ion implantation using a resist mask that has a smaller opening density as approaching the diode region.

* * * * *